United States Patent [19]
Smith et al.

[11] Patent Number: 5,985,364
[45] Date of Patent: Nov. 16, 1999

[54] METHOD OF EXHAUST CONTROL FOR SPIN-ON FILMS WITH REDUCED DEFECTS

[75] Inventors: Jonathan B. Smith, Fremont; C. Bradford Hopper, San Francisco, both of Calif.

[73] Assignee: Advanced Micro Devices, Inc., Sunnyvale, Calif.

[21] Appl. No.: 09/055,258

[22] Filed: Apr. 6, 1998

[51] Int. Cl.$^6$ ........................................................ B05D 3/12
[52] U.S. Cl. ...................... 427/240; 427/385.5; 437/231
[58] Field of Search ................................. 427/240, 385.5; 437/231

[56] References Cited

U.S. PATENT DOCUMENTS

| | | | |
|---|---|---|---|
| 5,670,210 | 9/1997 | Mandall | 427/240 |
| 5,716,673 | 2/1998 | Yen et al. | 427/240 |
| 5,827,782 | 10/1998 | Shih | 438/697 |

*Primary Examiner*—Janyce Bell

[57] ABSTRACT

Spin-on coatings are applied by ramping-up the exhaust level in the spin coating chamber to achieve a predetermined minimum exhaustion level prior to accelerating rotation of the coating substrate to a high speed to effect spreading of the coating fluid. The resulting spun-on coatings exhibit reduced defect formation and reduced aerosol particle redeposition thereon.

17 Claims, 3 Drawing Sheets

METHOD OF EXHAUST CONTROL FOR SPIN-ON FILMS WITH REDUCED DEFECTS

FIELD OF THE INVENTION

The invention relates to the formation of coatings on substrates by means of a spin-on coating process. The invention has particular applicability to formation of dielectric gap-fill and damascene style coatings on semiconductor substrates.

BACKGROUND OF THE INVENTION

Spin-on coating processes are conventionally employed in semiconductor processing to deposit a variety of layers on semiconductor substrates, typically single-crystal silicon wafers used in integrated circuit manufacture. In addition, spin-on coating processes enjoy utility in processes wherein the substrate to be coated does not exhibit a high degree of crystallinity, e.g. in the manufacture of low-cost photovoltaic solar cells employing economical multi-crystalline semiconductor materials.

Coating materials conventionally applied by spin-coating processes include but are not limited to: dopant containing materials which are subjected to post deposition treatment, such as heat treatment, to diffuse a dopant into a semiconductor substrate for forming e.g. a p-n diode junction therein; materials which upon post-deposition treatment form antireflective layers; electrically conductive materials for forming transparent or opaque electrodes or contacts; dielectric materials used as insulative layers, protective coatings, and gap-fill and damascene style metallization process materials; and photoresist materials used in photolithographic or other type selective patterning processing as by chemical or physical etching.

A conventional spin-on deposition technique of, for example, a dielectric material involves preparing a fluid consisting of the coating material dissolved, dispersed, or suspended in a suitable volatile solvent or other vehicle, along with any other process or product enhancing additive; dispensing an amount of the fluid on a substrate, e.g., a semiconductor wafer; and spinning the wafer with a rotational speed sufficient to spread the coating fluid in a uniform thickness over at least the portion of the wafer intended to be coated. The rotational speed, surface tension, and viscosity of the coating fluid generally determine the thickness of the resulting coating. Following spin-on deposition, the deposited film is cured at an elevated temperature and for a time sufficient to obtain a dielectric film having the desired properties.

A typical apparatus for spin-on coating of substrates, such as semiconductor wafers, is illustrated in FIG. 1 and comprises a coating chamber, generally 10, which includes a support 11 for mounting thereon a substrate 12, typically a semiconductor wafer comprising an integrated circuit. The support 11 is mounted on a rotatable shaft 13 which is coupled to a motor 14 for spinning the support 11. The chamber 10 is coupled through outlet 15 to an exhaust system (not shown). A dispenser 16 is provided above the height of the support 11 for introducing a fluid containing a desired coating material 17 or precursor thereof on the exposed upper surface of the wafer substrate 12.

A typical operational sequence, termed a "recipe", for applying a spin-on coating such as a dielectric gap fill material (e.g., methyl siloxane-based spin-on glass (SOG) or hydrogen silsesquioxane (HSQ)) to a semiconductor wafer including integrated circuitry formed therein or thereon is illustrated in FIG. 2. As may be apparent from FIG. 2, the recipe comprises several stages, including dispensing the coating material while spinning the wafer at a low speed, accelerating the rotation of the coated substrate to spread the coating material over the substrate surface in a desired thickness, and simultaneously increasing the exhaust level of the atmosphere surrounding the coated wafer.

More particularly, and with reference to the spin coating apparatus 10 illustrated in FIG. 1, a substrate, e.g. a silicon wafer 12, is mounted for rotation on support 11. Starting at time (t)=0 and continuing for a preselected dispense time interval ($t_d$), a preselected amount of fluidized coating material 17 is dispensed from dispenser 16 to form a mass at about the central portion of the wafer, while simultaneously rotating the substrate at a preselected relatively slow speed ($r_s$). During the dispensing interval ($t_d$), the atmosphere within the coating chamber 10 is maintained at ambient, i.e. atmospheric pressure. Immediately following completion of the dispense phase of the process, the spin rate is rapidly accelerated ("ramped up") over a short time interval ($t_a$) to reach a preselected, substantially faster rotational speed ($r_f$) which is sufficient to uniformly spread by centrifugal force the dispensed coating material 17 over at least a desired portion of the wafer 12. Concomitant with the acceleration of the wafer rotation speed, the atmosphere in the coating chamber 10 is exhausted by vacuum means (not shown) connected to exhaust port 15. The exhaust level is increased ("ramped up") over a preselected time interval ($t_r$) to reach a preselected exhaust level ($p_e$), and maintained at that level for the remaining time interval ($t_e$) of the process recipe. The rotational speed of the wafer is maintained at the substantially higher speed ($r_f$) for a preselected time interval ($t_s$) sufficient to ensure proper spreading of the dispensed coating material, and thereafter reduced to a lower rate over a preselected time interval ($t_f$). Finally, the coated wafer is removed from the spin-on chamber 10 and subjected to further processing, e.g. heat treatment, to develop a desired property or characteristic. In some instances, the dispensed coating material contains a precursor of the final coating material, in which instance the precursor must be subjected to additional processing in order to obtain the desired coating.

In the above-described process recipe, the principal function of exhausting of the atmosphere surrounding the coated wafer is to assist in removal by evaporation of volatile, non-coating components from the dispensed coating fluid, e.g. solvents, vehicles, flowing agents, viscosity adjusting agents, etc. However, solid components of the coating material fluid tend to become entrapped in the vapors of such evaporating components, particularly solvents, thereby forming aerosol type particulates which can redeposit on the surface of the coating layer if not removed quickly enough from the vicinity of the coating surface. The result of such aerosol particle formation and redeposition results in a coating containing surface protrusions and interior defects. Redeposition of aerosol particles is acutely problematic when depositing newer, low dielectric constant ("low k") spin-on materials, such as hydrogen silsesquioxane (HSQ), which employ volatile solvents such as methyl isobutyl ketone (MIBK). Accordingly, a need exists for spin-on methodology enabling the deposition of coatings, such as dielectric coatings, while substantially reducing or eliminating the generation of defects, particularly defects caused by redeposition of aerosol particles.

OBJECTS AND DISCLOSURE OF THE INVENTION

An object of the present invention is an improved recipe for depositing spin-on coatings having substantially reduced or virtually no defects.

A further object of the invention is a process recipe for spin-on coating which minimizes or eliminates redeposition of aerosol particles.

A still further object of the invention is a process recipe for spin-on coating which avoids the drawbacks of conventional recipes and can be performed utilizing conventional spin-on coating apparatus.

Additional objects, advantages, and other features of the present invention will be set forth in the description which follows and in part will become apparent to those having ordinary skill in the art upon examination of the following or may be learned from the practice of the invention. The objects and advantages may be realized and obtained as particularly pointed out in the appended claims.

According to the present invention, the foregoing and other objects are achieved in part by a method of applying a layer of a coating material to a surface of a substrate, the method comprising the steps of:

(a) providing a fluid containing the coating material or a precursor thereof;

(b) providing a substrate having a surface to be coated with the coating material;

(c) applying a selected amount of the coating fluid during a first predetermined interval to a central portion of the substrate surface while rotating the substrate about a central axis perpendicular to the substrate surface at a first, relatively low speed;

(d) during the applying step, exhausting the atmosphere surrounding the fluid-applied substrate to a preselected minimum level of exhaustion sufficient to remove from the coating fluid aerosol particles at a faster rate than volatile, non-coating material components; and (e) rotating the fluid-coated substrate at a second speed greater than the first speed and sufficient to uniformly spread the fluid over at least a desired portion of the surface while maintaining the preselected minimum level of exhaustion;

whereby redeposition of aerosol particles originating from the coating fluid and formation of defects in the layer of coating material are minimized or eliminated.

In embodiments of the invention, the substrate comprises a semiconductor wafer including integrated circuitry formed therein or thereon, and the spin-on coating material is a dielectric gap-fill or damascene style material.

In a further embodiment of the invention, the coating material fluid comprises hydrogen silsesquioxane (HSQ) and has a viscosity in the range of about 0.85 centipoise to about 1.25 centipoise (CP) at 21° C. the first predetermined interval for applying the coating material fluid is about 1.5 to about 3.5 sec. and the first relatively low rotational speed is about 300 rpm to about 500 rpm, the second, relatively high rotational speed is about 3500+/−500 rpm and is maintained for about 1.5 to about 3.0 sec., and exhausting of the atmosphere commences from about 0.3 to about 0.7 sec. prior to accelerating the substrate rotation for about 0.3 to about 0.7 sec. to the second, relatively high speed, at an exhaust ramp-up rate greater than about 15 mm $H_2O$/sec. to a minimum exhaust level of about 15+/−5 mm $H_2O$.

Additional objects and advantages of the present invention will become readily apparent to those skilled in this art from the following detailed description, wherein only the preferred embodiments of the invention are shown and described, simply by way of illustration but not limitation. As will be realized, the invention is capable of other and different embodiments, and its several details are capable of modification in various obvious respects, all without departing from the spirit of the invention. Accordingly, the drawings and description are to be regarded as illustrative in nature, and not as restrictive.

DESCRIPTION OF THE INVENTION

Figure 1:
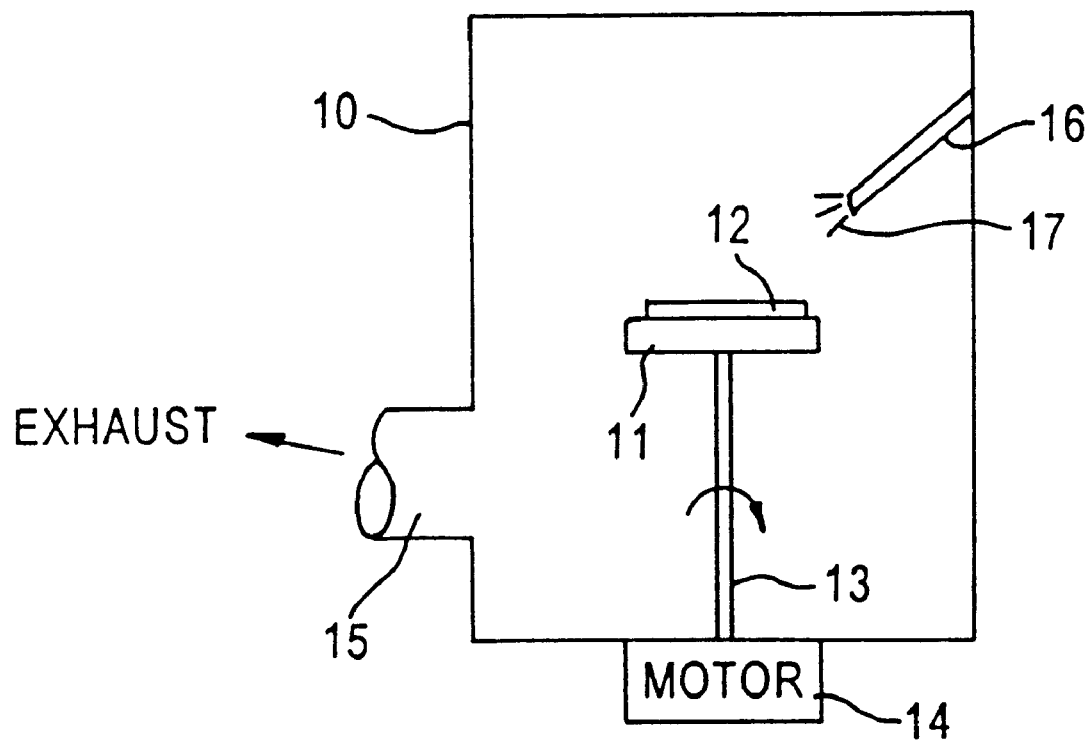
FIG. 1 is a simplified schematic cross-sectional view of an apparatus for performing spin-coating of a substrate.
Figure 2:
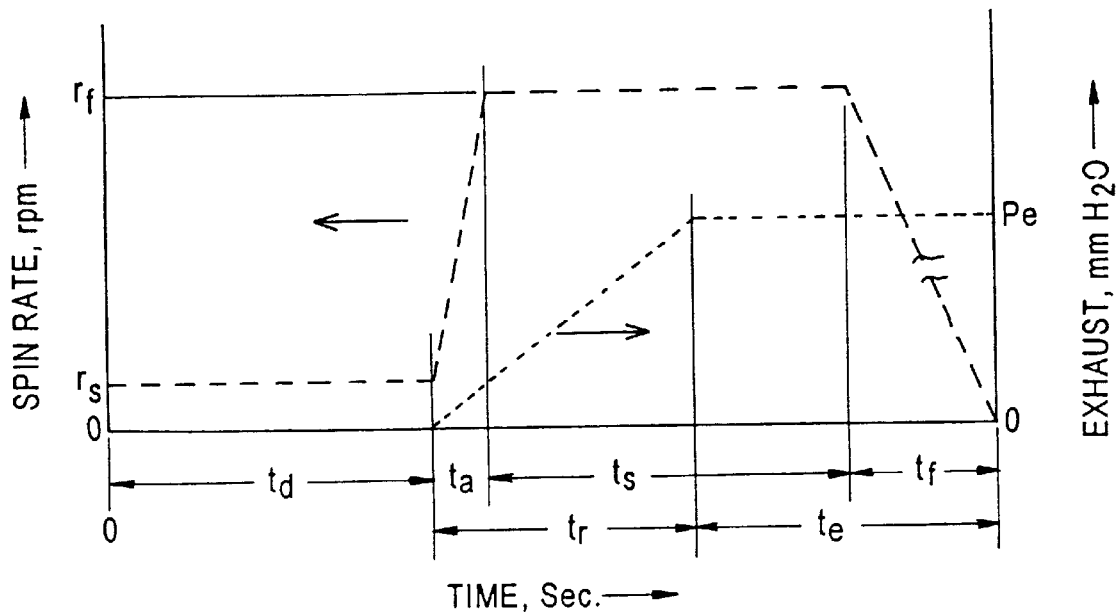
FIG. 2 is a graph illustrating a conventional recipe for spin coating of a substrate using an apparatus such as shown in FIG. 1.
Figure 3:
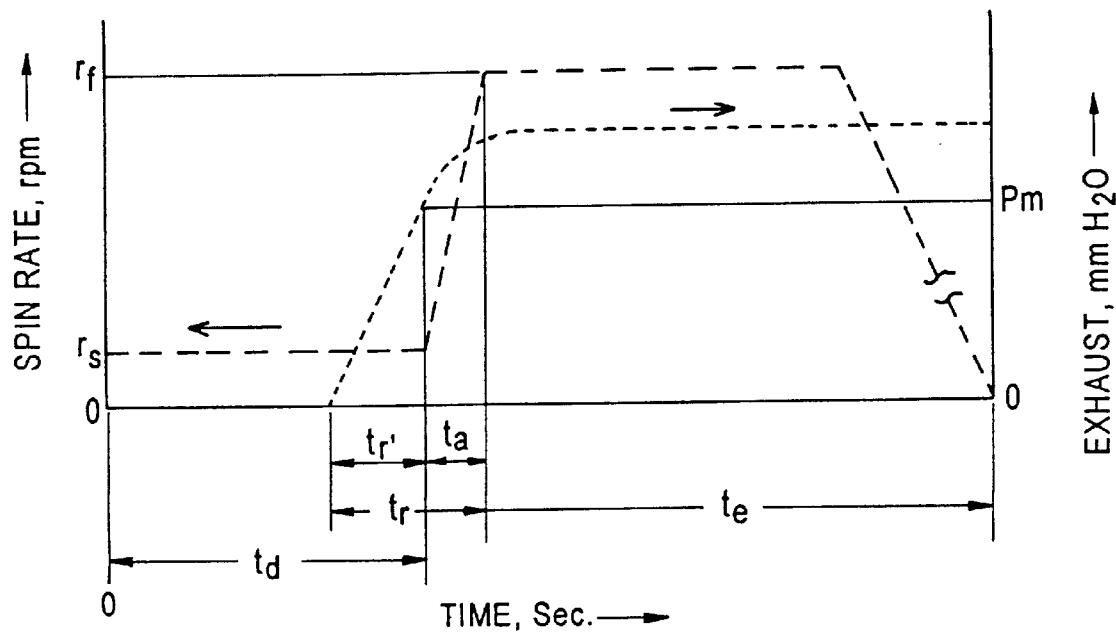
FIG. 3 is a graph illustrating a recipe for spin coating according to the process of the invention.
Figure 4:
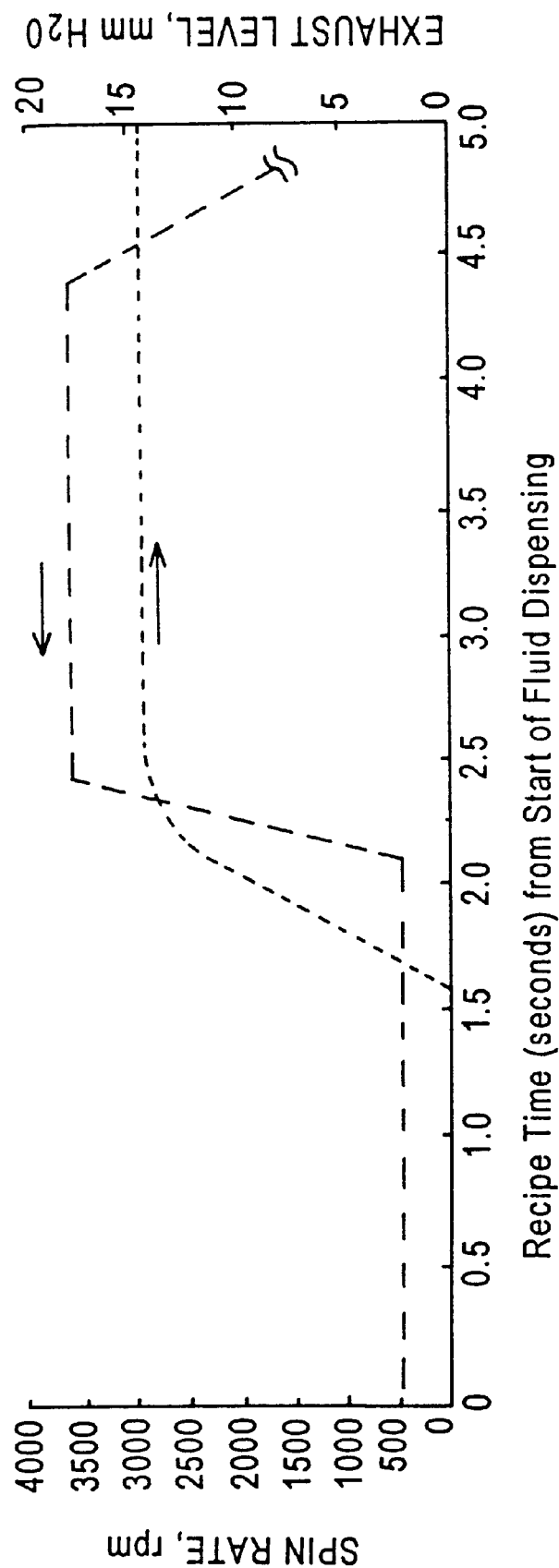
FIG. 4 is a graph illustrating a recipe for spin coating of hydrogen silsesquioxane (HSQ) according to the process of the invention.

A process recipe according to the present invention, in terms of the spin rate profile, exhaust profile, and the relationship therebetween, is illustrated in FIG. 3. As is evident from a comparison of FIGS. 2 and 3, the spin rate profile according to the process recipe of the present invention is generally similar to the conventional process. However, in contrast with the conventional process, the exhaust profile in FIG. 3 is substantially altered from that shown in FIG. 2 by implementing the significance of removal of all volatile coating fluid components and aerosol particles generated by the volatilization process from the atmosphere surrounding the coated substrate prior rather than subsequent to acceleration of the spin rate to the higher speed sufficient to spread the coating fluid over the surface of the substrate. After extensive experimentation and investigation, it was discovered that a certain minimum level of exhaustion ($p_m$), at which the aerosol vapor is removed at a faster rate than the "effective" evaporation rate of the solvent, must be achieved prior to reaching the high speed substrate rotation required for uniformly spreading the coating fluid. The "effective" evaporation rate, in the context of the invention, takes into consideration the acceleration rate of the substrate and its ultimate high speed spin rate, in addition to the solvent evaporation rate per se.

More specifically, ramp-up of the exhaustion level of the coating chamber commences at a time and for an interval ($t_r$) during the time interval ($t_d$) for dispensing of coating fluid prior to acceleration of the spin rate during time interval ($t_a$), and proceeds at a faster rate than is conventional, i.e. at a rate sufficient to achieve the minimum level of exhaustion ($p_m$) prior to completion of the acceleration to the high spin rate ($r_f$). Preferably, the exhaust ramp-up rate is selected such that ($p_m$) is achieved at or before commencement of acceleration. Exhaust ramp-up may continue, if desired, for an additional time interval such that a total ramp-up time ($t_r$) is greater than the ramp-up time ($t_{r'}$) for achieving the minimum exhaustion level ($p_m$).

The above-described process recipe of the invention advantageously prevents redeposition of aerosol particles during the main (i.e. high speed) spin step by removing the aerosol vapor at a rate faster than the effective evaporation rate of the solvent, resulting in spin-on coatings with a reduced amount of defects caused by entrapment therein of redeposited aerosol particles.

The present invention finds particular utility in semiconductor fabrication processes employing spin-on coatings of low-k dielectric gap-fill materials (e.g., HSQ) which contain volatile solvents, e.g. methyl isobutyl ketone (MIBK). FIG.

4 illustrates a spin-on process recipe developed for HSQ according to the principles of the invention.

As illustrated therein, for an HSQ containing spin-on coating fluid having a viscosity of from about 0.85 centipoise (CP) to about 1.25 centipoise at 21° C. (Dow Corning FOx™ series, Dow Corning Corp., Midland, Mich.), the predetermined time interval for dispensing the coating fluid in the central portion of a semiconductor wafer substrate is about 1.5 to about 3.5 sec., during which period the substrate is spun at a relatively slow rotation rate of about 300 to about 500 rpm. Following dispensing of the coating fluid, the wafer rotation rate is rapidly accelerated (e.g., in about 0.3 to about 0.7 sec.) to the predetermined relatively high speed of about 3,500+/−500 rpm and maintained at that high speed for a predetermined interval of about 1.5 to about 3.0 sec., during which interval the initial mass of dispensed coating fluid spreads uniformly over at least the desired portion of the substrate surface. The wafer is thereafter decelerated for removal of the coated wafer from the coating chamber. According to the present invention, exhaustion of the atmosphere surrounding the fluid-coated wafer substrate commences at least about 0.3 to about 0.7 sec. prior to acceleration of the spin rate for about 0.3 to about 0.7 sec. to the high rotation rate main spin segment of the process recipe and at an exhaust ramp-up rate higher than in the conventional process, e.g., at an exhaust ramp-up rate greater than about 15 mm $H_2O$/sec. to an ultimate exhaust level of about 15+/−5 mm $H_2O$. As a consequence of modifying the exhaust level profile in accordance with the present invention, a minimum exhaust level in the range of about 10 to about 15 mm $H_2O$ is achieved prior to reaching the high rotation, thereby significantly reducing or substantially eliminating aerosol particle entrapment and formation of defects in the coating.

EXAMPLE

Experiments were conducted with Dow Corning FOx-15™ (Dow Corning Corp., Midland, Mich.) which confirmed the benefits of the present invention. The experiments demonstrated that the process recipe of the invention, wherein the exhaust ramp-up rate is increased relative to the conventional recipe and the exhaust ramp-up phase is advanced in time to achieve a predetermined minimum level of exhaustion prior to reaching the high rotation rate, the numbers of defects and redeposited aerosol particles in or on spun-on semiconductor wafer coatings of HSQ were significantly reduced as determined by microscopic examination. The experimental results are reported in Table 1 below. It is apparent from the data in Table 1 that the process recipe according to the invention dramatically reduced the number of defects of size >0.9 u and aerosol particles in or on the coating to substantially 0, thereby demonstrating the efficacy of the inventive process recipe.

TABLE 1

| Exhaust Rate, mm $H_2O$/sec | Exhaust Advance, sec. | Total No. Defects | No. Defects >0.9 u | No. Aerosol Defects | No. Defects = 0.5 u |
|---|---|---|---|---|---|
| 10 | 0 | 96 | 40 | 22 | n/a |
| 18 | 0 | 19 | 3 | 5 | n/a |
| 26 | 0 | 67 | 13 | 12 | n/a |
| 10 | 0.5 sec. | 43 | 0 | 0 | 3 |
| 18 | 0.5 sec. | 57 | 0 | 0 | 5 |
| 26 | 0.5 sec. | 34 | 0 | 0 | 1 |
| 10 | 2.1 sec. | 38 | 0 | 0 | 4 |
| 18 | 2.1 sec. | 37 | 0 | 0 | 0 |
| 26 | 2.1 sec. | 26 | 0 | 0 | 6 |

Note: "total defects" includes particles of sizes 0.2 u or less and not accurately classifiable; thus "false defects" may be included in the measurement.

The present invention is applicable to the spin-on deposition of various types of coatings. The present invention enjoys particular applicability in manufacturing various types of semiconductor devices, notably in depositing low-k dielectric gap-fill materials such as HSQ.

Only a preferred embodiment of the present invention and an example of its utility have been illustrated above. It is to be understood that the essential principles of the invention are applicable to all manner of spin-coating materials susceptible to aerosol particle redeposition and defect formation, wherein determination of the various relevant recipe parameters is well within the scope of the artisan. It is further understood that the invention is susceptible of changes or modifications within the scope of the inventive concept as expressed herein.

What is claimed is:

1. A method of applying a layer of coating material to a surface of a substrate, the method comprising the steps of:

providing a fluid containing said coating material or a precursor thereof;

providing a substrate having a surface to be coated with said coating material;

dispensing a selected amount of said fluid during a first predetermined interval to a central portion of said substrate surface while rotating the substrate about a central axis perpendicular to said substrate surface at a first, relatively low speed;

during said dispensing step and at a predetermined time after dispensing begins, exhausting the atmosphere surrounding the fluid-applied substrate to a preselected minimum level of exhaustion sufficient to remove aerosol particles at a faster rate than volatile, non-coating material components from said fluid; and rotating the fluid-coated substrate directly from said first speed to a second speed greater than the first speed and sufficient to uniformly spread the fluid over at least a portion of the surface while maintaining said preselected minimum level of exhaustion; whereby redeposition of aerosol particles originating from said fluid and formation of defects in the layer of coating material are minimized or substantially eliminated.

2. The method as in claim 1, comprising: at the end of said first predetermined interval, accelerating rotation of said substrate for a second predetermined interval to achieve said second rotational speed; maintaining said second rotational speed for a third predetermined interval; and thereafter decelerating rotation of said substrate.

3. The method as in claim 2, comprising commencing said exhaustion during said first predetermined interval at a rate sufficient to achieve said preselected minimum level of exhaustion prior to said acceleration to said second rotational speed.

4. The method as in claim 3, comprising: increasing the level of exhaustion substantially linearly until reaching said preselected minimum level of exhaustion prior to achieving said second rotational speed; and maintaining said preselected minimum level of exhaustion substantially constant thereafter.

5. The method as in claim 4, wherein the substrate comprises a semiconductor wafer.

6. The method as in claim 5, wherein the coating material is selected from the group consisting of: dopant containing materials, antireflective coating materials, electrically conductive materials, dielectric materials, and photoresist materials.

7. The method as in claim 6, comprising further treating the coated substrate to develop a desired property or characteristic.

8. The method as in claim 7, wherein the further treatment comprises heat treating the coated substrate.

9. A coated substrate made according to the process of claim 7.

10. The method as in claim 6, wherein the coating material is a dielectric material.

11. The method as in claim 9, wherein the dielectric material is used in a gap-fill metallization process or damascene style metallization process.

12. The method as in claim 11, wherein the dielectric material comprises spin-on glass (SOG).

13. The method as in claim 11, wherein the dielectric material comprises a low dielectric constant (low k) material.

14. The method as in claim 13, wherein the low k material is hydrogen silsesquioxane (HSQ).

15. The method as in claim 14, wherein the coating material fluid comprises HSQ and has a viscosity in the range of about 0.85 centipoise (CP) to about 1.25 centipoise at 21° C.

16. The method as in claim 15, wherein: said first predetermined interval for dispensing coating material fluid is about 1.5 to about 3.5 sec. and said first relatively low rotational speed is about 300 to about 500 rpm; said second predetermined interval for accelerating rotation is about 0.3 to about 0.7 sec.; said second, relatively high rotational speed is about 3500+/−500 rpm and is maintained for about 1.5 to about 3.0 sec.; and said exhausting commences from about 0.3 to about 0.7 sec. prior to said second predetermined interval for accelerating rotation, at an exhaust ramp-up rate greater than about 15mm $H_2O$/sec., to a minimum exhaust level of about 15+/−5 mm $H_2O$.

17. A coated substrate made according to the process of claim 16.

* * * * *